United States Patent
Du et al.

(10) Patent No.: US 10,839,893 B2
(45) Date of Patent: Nov. 17, 2020

(54) MEMORY CELL WITH CHARGE TRAP TRANSISTORS AND METHOD THEREOF CAPABLE OF STORING DATA BY TRAPPING OR DETRAPPING CHARGES

(71) Applicant: Kneron (Taiwan) Co., Ltd., Taipei (TW)

(72) Inventors: Yuan Du, Los Angeles, CA (US); Mingzhe Jiang, San Diego, CA (US); Junjie Su, San Diego, CA (US); Chun-Chen Liu, San Diego, CA (US)

(73) Assignee: Kneron (Taiwan) Co., Ltd., Taipei (TW)

( * ) Notice: Subject to any disclaimer, the term of this patent is extended or adjusted under 35 U.S.C. 154(b) by 0 days.

(21) Appl. No.: 16/553,109

(22) Filed: Aug. 27, 2019

(65) Prior Publication Data

US 2020/0105338 A1     Apr. 2, 2020

Related U.S. Application Data

(60) Provisional application No. 62/737,929, filed on Sep. 28, 2018.

(51) Int. Cl.
*G11C 11/412*     (2006.01)
*G11C 11/419*     (2006.01)
(Continued)

(52) U.S. Cl.
CPC .......... *G11C 11/412* (2013.01); *G11C 11/419* (2013.01); *H01L 27/0886* (2013.01); *H01L 29/792* (2013.01)

(58) Field of Classification Search
CPC ..... G11C 11/412; G11C 11/419; G11C 16/28; G11C 16/24; G11C 16/10; G11C 16/0483;
(Continued)

(56) References Cited

U.S. PATENT DOCUMENTS

| 2014/0036595 A1* | 2/2014 | BinBoga | G11C 16/24 365/185.19 |
| 2015/0091080 A1* | 4/2015 | Sun | H01L 29/66545 257/326 |

(Continued)

OTHER PUBLICATIONS

B. Jayaraman et al., "80-kb Logic Embedded High-K Charge Trap Transistor-Based Multi-Time-Programmable Memory With no Added Process Complexity," IEEE Journal of Solid-State Circuits, vol. 53, No. 3, pp. 949-960, Mar. 2018.

*Primary Examiner* — Jerome Leboeuf
(74) *Attorney, Agent, or Firm* — Winston Hsu

(57) ABSTRACT

A memory cell includes a first charge trap transistor and a second charge trap transistor. The first charge trap transistor has a substrate, a first terminal coupled to a first bitline, a second terminal coupled to a signal line, a control terminal coupled to a wordline, and a dielectric layer formed between the substrate of the first charge trap transistor and the control terminal of the first charge trap transistor. The second charge trap transistor has a substrate, a first terminal coupled to the signal line, a second terminal coupled to a second bitline, a control terminal coupled to the wordline, and a dielectric layer between the substrate of the second charge trap transistor and the control terminal of the second charge trap transistor. Charges are either trapped to or detrapped from the dielectric layer of the first charge trap transistor when writing data to the memory cell.

8 Claims, 3 Drawing Sheets

(51) Int. Cl.
*H01L 27/088* (2006.01)
*H01L 29/792* (2006.01)

(58) Field of Classification Search
CPC ......... G11C 16/0466; G11C 7/18; G11C 7/12; G11C 8/14; G11C 8/08; G11C 11/418; H01L 27/0886; H01L 29/792; H01L 29/785
See application file for complete search history.

(56) References Cited

U.S. PATENT DOCUMENTS

| | | | | |
|---|---|---|---|---|
| 2015/0318043 A1* | 11/2015 | Chishti | ............... | G11C 11/5692 365/185.21 |
| 2017/0178698 A1* | 6/2017 | Van Houdt | ............. | H01L 28/00 |

* cited by examiner

US 10,839,893 B2

MEMORY CELL WITH CHARGE TRAP TRANSISTORS AND METHOD THEREOF CAPABLE OF STORING DATA BY TRAPPING OR DETRAPPING CHARGES

CROSS REFERENCE TO RELATED APPLICATIONS

This application claims the benefit U.S. provisional application No. 62/737,929, filed on Sep. 28, 2018 and incorporated herein by reference.

BACKGROUND OF THE INVENTION

1. Field of the Invention

The present invention is related to a memory cell, and more particularly, it is related to a memory cell with charge trap transistors capable of storing data by trapping or detrapping charges.

2. Description of the Prior Art

Static random access memory (SRAM) is indispensable to the current integrated circuits (IC) as the main on-chip cache memory. Conventional SRAM cells typically comprise six transistors. This results in large size and power consumption. With the advancement of the electronic devices, IC of lower power consumption and smaller scale are necessary. Therefore, there is a strong motivation to investigate other memory concepts.

Charge trapping phenomenon is well known in devices using flash memory. However, it is not favored for high performance logic or low cost foundry technologies because it may require additional masks, higher process complexity, or its operating voltage is incompatible. On the other hand, a fully logic-compatible charge trap transistor is reported in 22 nm MOSFET and 14 nm FinFET technology that do not add process complexity or masks. With enhanced and stabilized charge trapping behavior, charge trap transistors show promise to be used in high performance memory such as SRAM.

SUMMARY OF THE INVENTION

An embodiment discloses a memory cell including a first charge trap transistor and a second charge trap transistor. The first charge trap transistor has a substrate, a first terminal formed on the substrate and coupled to a first bitline, a second terminal formed on the substrate and coupled to a signal line, a control terminal coupled to a wordline, and a dielectric layer formed between the substrate of the first charge trap transistor and the control terminal of the first charge trap transistor. The second charge trap transistor has a substrate, a first terminal coupled to the signal line, a second terminal coupled to a second bitline, a control terminal coupled to the wordline, and a dielectric layer between the substrate of the second charge trap transistor and the control terminal of the second charge trap transistor. Charges are either trapped to or detrapped from the dielectric layer of the first charge trap transistor when writing data to the memory cell.

Another embodiment discloses a method for controlling the memory cell. The method includes trapping charges to or detrapping charges from the dielectric layer of the first charge trap transistor to change a threshold voltage of the first charge trap transistor, and comparing a voltage of the first bitline with a voltage of the second bitline to determine data stored in the memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
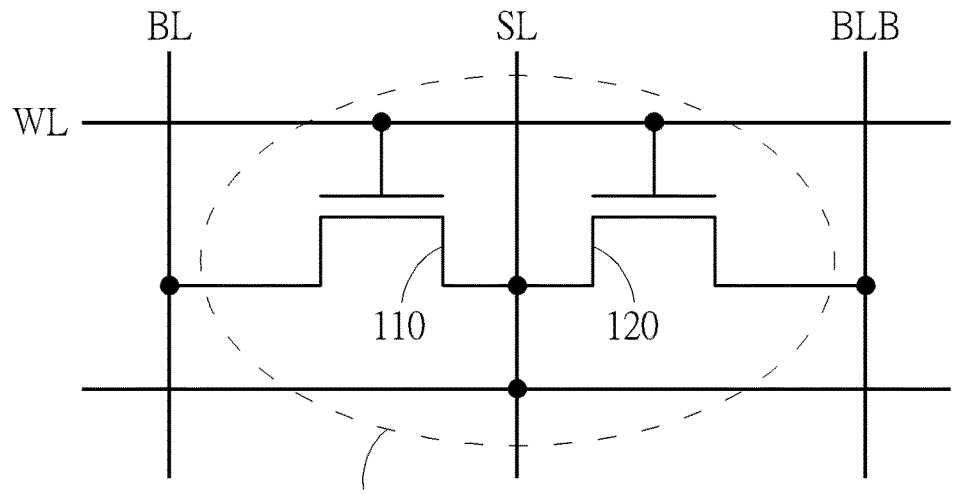
FIG. 1 is a diagram of an embodiment for a memory cell.
Figure 2:
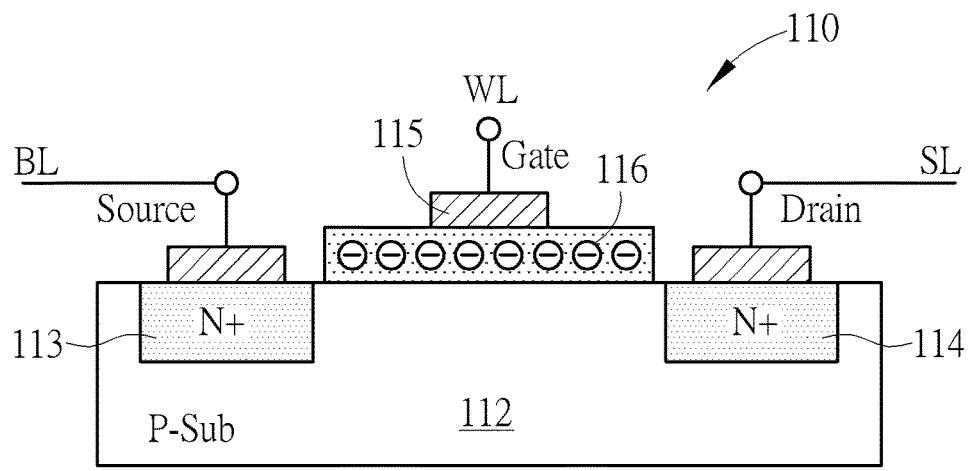
FIG. 2 shows the structure of the first charge trap transistor.
Figure 3:
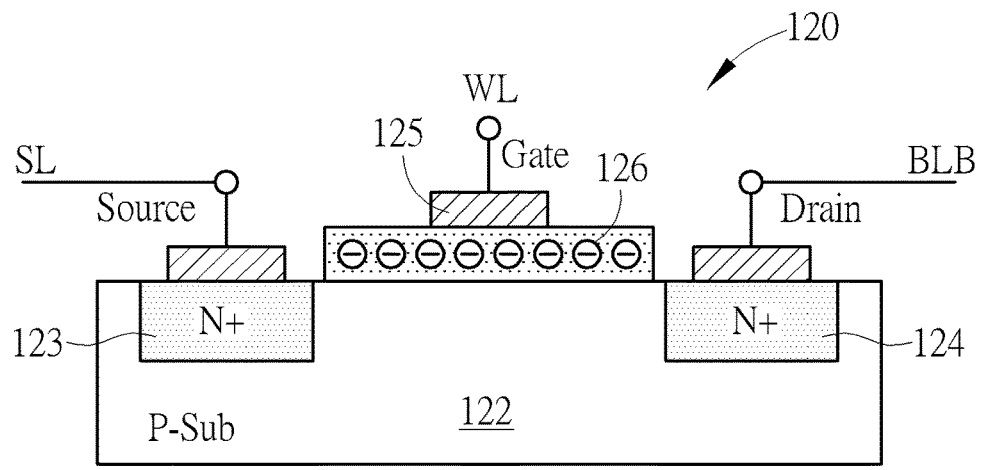
FIG. 3 shows a structure of the second charge trap transistor.

FIG. 1 is a diagram of an embodiment for a memory cell 100. The memory cell 100 comprises a first charge trap transistor 110 and a second charge trap transistor 120. FIG. 2 shows the structure of the first charge trap transistor 110. The first charge trap transistor 110 has a substrate 112 which may be a p-type substrate, a first terminal 113 which may be an n-type source terminal formed on the substrate 112 and coupled to a first bitline BL, a second terminal 114 which may be an n-type drain terminal formed on the substrate 112 and coupled to a signal line SL, a control terminal 115 which may be a gate terminal coupled to a wordline WL and a dielectric layer 116 which comprises high-k dielectric material such as $HfO_2$ or $HfSiO_x$. FIG. 3 shows a structure of the second charge trap transistor 120. The second charge trap transistor 120 has a substrate 122 which may be a p-type substrate, a first terminal 123 which may be an n-type source terminal formed on the substrate 122 and coupled to the signal line SL, a second terminal 124 which may be an n-type drain terminal formed on the substrate 122 and coupled to a second bitline BLB, a control terminal 125 which may be a gate terminal coupled to the wordline WL and a dielectric layer 126 which comprises high-k dielectric material such as $HfO_2$ or $HfSiO_x$. The first charge trap transistor 110 has a first threshold voltage VT1 and the second charge trap transistor 120 has a second threshold voltage VT2.

Figure 4:
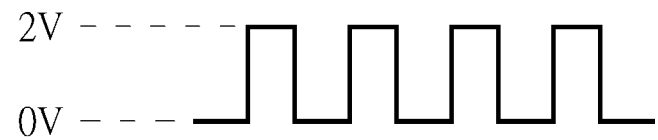
FIG. 4 shows positive voltage pulses applied to the control terminal for charge trapping operation on the first charge trap transistor.
Figure 5:
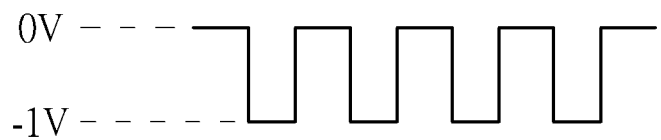
FIG. 5 shows negative voltage pulses applied to the control terminal for charge detrapping operation on the first charge trap transistor.

FIGS. 4 and 5 show voltage pulses applied to the control terminal 115 for charge trapping and detrapping operation on the first charge trap transistor 110. The first threshold voltage VT1 is modulated by the amount of charges trapped in the high-k gate dielectric layer 116 of the first charge trap transistor 110. Charges are trapped to the dielectric layer 116 by applying microsecond positive voltage pulses, for example 2V pulses, (shown in FIG. 4) on the control terminal 115. Charges are detrapped from the dielectric layer 116 by applying microsecond negative voltage pulses, for example −1V pulses, (shown in FIG. 5) on the control terminal 115.

Figure 6:
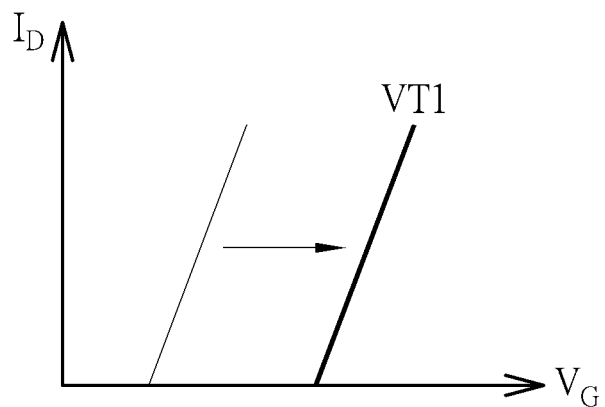
FIG. 6 shows a measured drain current with respect to a gate voltage at the control terminal of the first charge trap transistor during charge trapping operation.
Figure 7:
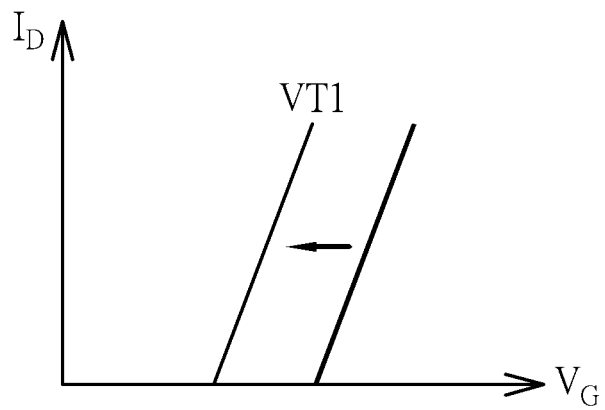
FIG. 7 show a measured drain current with respect to a gate voltage $V_G$ at the control terminal of the first charge trap transistor during charge detrapping operation.

FIGS. 6 and 7 show a measured drain current $I_D$ (from the second terminal to the first terminal) with respect to a gate voltage $V_G$ at the control terminal of the first charge trap transistor 110. Trapping charges increases the threshold voltage VT1 while detrapping charges decreases the threshold voltage VT1.

An example of the operating method of the memory cell 100 is described in the following description. A data bit of 1 is written by trapping charges to the dielectric layer 116 of the first charge trap transistor 110. It is obtained by activating the wordline WL with 2V voltage pulses and discharging the first bitline BL to 0V while raising the signal line SL and the second bitline BLB to 1.5V, resulting in a current only to the first charge trap transistor 110, trapping charges to the dielectric layer 116 of the first charge trap transistor 110. When the first threshold voltage VT1 increases from substantially equal to the second threshold voltage VT2 to be higher than the second threshold voltage VT2, the data bit turns to 1.

A data bit of 0 is obtained by detrapping charges from the dielectric layer 116 of the first charge trap transistor 110. It is obtained by activating the wordline WL with −1V voltage pulses and setting the first bitline BL to float while raising the signal line SL and the second bitline BLB to 2V resulting in detrapping charges from the dielectric layer 116 of the first charge trap transistor 110. When the first threshold voltage VT1 decreases from substantially equal to the second threshold voltage VT2 to be lower than the second threshold voltage VT2, the data bit turns to 0.

During a read operation, the wordline WL is charged to a system voltage VDD, and the signal line SL is charged to the system voltage VDD. Then, the first bitline BL and the second bitline BLB are discharged, leading to a differential voltage of the bitline pair (BL and BLB). The differential voltage is determined by the difference of charges trapped in the first charge trap transistor 110 and the second charge trap transistor 120. The data stored in the memory cell 100 is determined by comparing the voltage of the first bitline BL with the voltage of the second bitline BLB. When the memory cell 100 stores a data bit of 0, the voltage of the first bitline BL is lower than the voltage of the second bitline BLB. When storing a data bit of 1, the voltage of the first bitline BL is higher than the voltage of the second bitline BLB.

Figure 8:
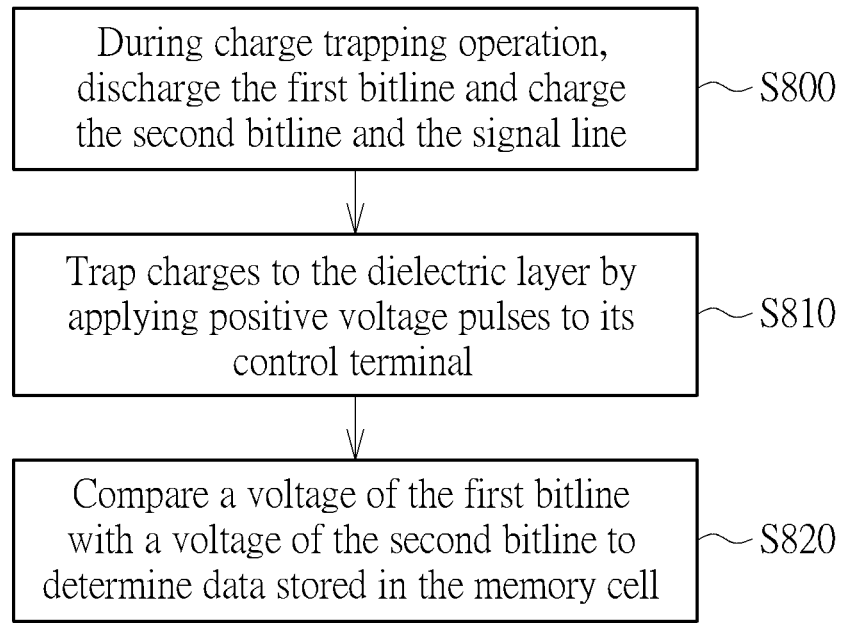
FIG. 8 is a flowchart of the method for controlling the memory cell.

FIG. 8 is a flowchart of the method for controlling the memory cell 100. The method can include the following steps:

S800: During charge trapping operation, discharge the first bitline BL and charge the second bitline BLB and the signal line SL;

S810: Trap charges to the dielectric layer 116 of the first charge trap transistor 110 by applying positive voltage pulses to its control terminal, resulting in increasing the threshold voltage VT1;

S820: Compare a voltage of the first bitline BL with a voltage of the second bitline BLB to determine data stored in the memory cell.

Figure 9:
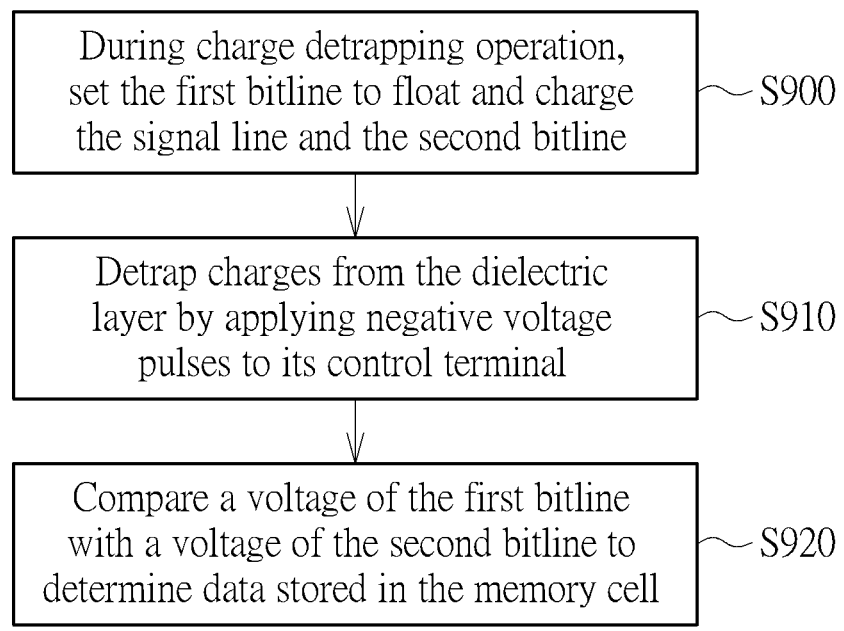
FIG. 9 is a flowchart of the method for controlling the memory cell.

FIG. 9 is a flowchart of another method for controlling the memory cell 100. The method can include the following steps:

S900: During charge detrapping operation, set the first bitline BL to float and charge the signal line SL and the second bitline BLB;

S910: Detrap charges from the dielectric layer 116 of the first charge trap transistor 110 by applying negative voltage pulses to its control terminal, resulting in decreasing the threshold voltage VT1;

S920: Compare a voltage of the first bitline BL with a voltage of the second bitline BLB to determine data stored in the memory cell.

The disclosed embodiment has the advantage of achieving high performance memory switching with lower power consumption and smaller scale, improving overall integrated circuit scaling.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
   a first charge trap transistor comprising:
      a substrate;
      a first terminal formed on the substrate and coupled to a first bitline;
      a second terminal formed on the substrate and coupled to a signal line;
      a control terminal coupled to a wordline; and
      a dielectric layer formed between the substrate of the first charge trap transistor and the control terminal of the first charge trap transistor; and
   a second charge trap transistor comprising:
      a substrate;
      a first terminal formed on the substrate and coupled to the signal line;
      a second terminal formed on the substrate and coupled to a second bitline;
      a control terminal coupled to the wordline; and
      a dielectric layer formed between the substrate of the second charge trap transistor and the control terminal of the second charge trap transistor;
   wherein charges are trapped to the dielectric layer of the first charge trap transistor when a first logic value is to be stored in the memory cell, charges are detrapped from the dielectric layer of the first charge trap transistor when a second logic value is to be stored in the memory cell, and charges are detrapped from the dielectric layer of the first charge trap transistor by setting the first bitline to float, charging the signal line and the second bitline, and applying negative voltage pulses to the control terminal of the first charge trap transistor.

2. The memory cell of claim 1, wherein when charges are trapped to the dielectric layer of the first charge trap transistor, a threshold voltage of the first charge trap transistor increases.

3. The memory cell of claim 2, wherein a voltage of the first bitline is compared with a voltage of the second bitline to determine data stored in the memory cell.

4. The memory cell of claim 1, wherein when charges are detrapped from the dielectric layer of the first charge trap transistor, a threshold voltage of the first charge trap transistor decreases.

5. The memory cell of claim 4, wherein a voltage of the first bitline is compared with a voltage of the second bitline to determine data stored in the memory cell.

6. The memory cell of claim 1, wherein the first charge trap transistor and the second charge trap transistor are n-type metal oxide semiconductor field effect transistors.

7. The memory cell of claim 1, wherein the first charge trap transistor and the second charge trap transistor are n-type Fin field effect transistors.

8. A method for controlling a memory cell, the memory cell comprising a first charge trap transistor and a second charge trap transistor, the first charge trap transistor comprising a first terminal coupled to a first bitline, a second terminal coupled to a signal line, and a control terminal coupled to a wordline, the second charge trap transistor comprising a first terminal coupled to the signal line, a second terminal coupled to a second bitline, and a control terminal coupled to the wordline, the method comprising:

setting the first bitline to float charging the signal line and the second bitline;

applying negative voltage pulses to the control terminal of the first charge trap transistor; and comparing a voltage of the first bitline with a voltage of the second bitline to determine data stored in the memory cell.

\* \* \* \* \*